(12) United States Patent
Khurana

(10) Patent No.: US 7,636,155 B2
(45) Date of Patent: Dec. 22, 2009

(54) SYSTEM AND METHOD FOR RESOLVING PHOTOEMISSION FROM SEMICONDUCTOR DEVICES

(75) Inventor: Neeraj Khurana, Monte Sereno, CA (US)

(73) Assignee: DCG Systems, Inc., Fremont, CA (US)

( * ) Notice: Subject to any disclaimer, the term of this patent is extended or adjusted under 35 U.S.C. 154(b) by 502 days.

(21) Appl. No.: 11/624,553

(22) Filed: Jan. 18, 2007

(65) Prior Publication Data
US 2008/0174770 A1    Jul. 24, 2008

(51) Int. Cl.
*G01N 21/00*    (2006.01)
(52) U.S. Cl. .............. 356/237.1; 356/237.4; 356/237.6; 324/750; 324/752; 324/537
(58) Field of Classification Search ... 356/237.1–237.6, 356/445; 324/750, 752, 537; 382/144, 145, 382/151, 154
See application file for complete search history.

(56) References Cited

U.S. PATENT DOCUMENTS

| 5,208,648 | A | 5/1993 | Batchelder et al. |
| 5,220,403 | A | 6/1993 | Batchelder et al. |
| 5,940,545 | A | 8/1999 | Kash et al. |
| 7,439,730 | B2 * | 10/2008 | Desplats et al. ............. 324/750 |

OTHER PUBLICATIONS

Yee, W.M., et al., "Laser Voltage Probe (LVP): A Novel Optical Probing Technology for Flip-Chip Packaged Microprocessors," *International Symposium for Testing and Failure Analysis (ISFTA)*, 2000, pp. 3-8.

Bruce, Mike, et al., "Waveform Acquisition from the Backside of Silicon Using Electro-Optic Probing," *Proceedings from the 25th International Symposium for Testing and Failure Analysis*, Nov. 14-18, 1999, pp. 19-25.

Kolachina, S., et al., "Optical Waveform Probing—Strategies for Non-Flipchip Devices and Other Applications," *International Symposium for Testing and Failure Analysis (ISFTA)*, 2001, pp. 51-57.

Soref, Richard A., et al., "Electrooptical Effects in Silicon," *IEEE Journal of Quantum Electronics*, Jan. 1987, vol. QE-23 No. 1.

(Continued)

*Primary Examiner*—Gregory J Toatley, Jr.
*Assistant Examiner*—Iyabo S Alli
(74) *Attorney, Agent, or Firm*—Nixon Peabody LLP; Joseph Bach, Esq.

(57) ABSTRACT

A method for isolating the emitting devices may be applied to various emission and laser microscopy systems. A point spread function is convolved with CAD data of devices involved in the emission. The calculated signal intensity of the devices is varied until the difference between the calculated signal and the measured signal provides best fit. The best fit is performed for each on/off state for all configurations of the involved devices. The variance of the best curve fit for all of the configurations is used to assign probability to each state. The best fit indicates the correct state of each of the involved devices, thereby indicating which devices emit. At times, when the transistors are extremely close, a weighted solution is calculated. The weights are based on the probability of each solution.

20 Claims, 7 Drawing Sheets

OTHER PUBLICATIONS

Kasapi, Steven, et al., "Laser Beam Backside Probing of CMOS Integrated Circuits," *Microelectronics Reliability*, 1999, pp. 957-961, 39.

Wilsher, Ken, et al., "Integrated Circuit Waveform Probing Using Optical Phase Shift Detection," *Proceedings from the 26th Internationsl Symposium for Testing and Failure Analysis*, Nov. 12-16, 2000, pp. 479-485, Bellevue, Washington.

Heinrich, H.K., "Picosecond Noninvasive Optical Detection of Internal Electrical Signals in Flip-Chip-Mounted Silicon Integrated Circuits," *IBM J. Res. Development*, Mar./May 1990, vol. 34, No. 2/3.

Heinrich, H.K., et al., "Noninvasive Sheet Charge Density Probe for Integrated Silicon Devices," *Appl. Phys. Lett. 48* (16), Apr. 21, 1986, *American Institute of Physics*.

Hemenway, B.R., et al., "Optical Detection of Charge Modulation in Silicon Integrated Circuits Using a Multimode Laser-Diode Probe," *IEEE Electron Device Letters*, Aug. 1987, Voo. EdL-8, No. 8.

Black, A. et al., "Optical Sampling of GHz Charge Density Modulation in Silicon Bipolar Junction Transistors," Electronics Letter, 1987, vol. 23, No. 15, pp. 783-784.

Heinrich, H.K., et al.,"Erratum: Noninvasive Sheet Charge Density Probe for Integrated Silicon Devices," *Appl. Phys. Lett.* 1986, 48, 1066.

Heinrich, H.K., et al., "Measurement of Real-Time Digital Signals in a Silicon Bipolar Junction Transistor Using A Noninvasive Optical Probe," *IEEE Electronics Letters*, Jun. 5, 1986, pp. 650-652, vol. 22, No. 12.

Bockelman, Daniel R., et al., "Infrared Emission-based Static Logic State Imaging on Advanced Silicon Technologies," *Proceedings from the 28th International symposium for Testing and Failure Analysis*, Nov. 3-7, 2002, pp. 531-537, Pheonix, Arizona.

* cited by examiner

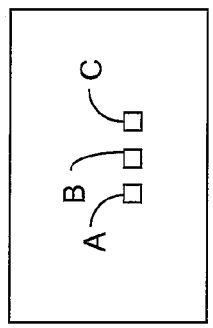
Table 1
| STATE | A B C |
|---|---|
| 1 | 000 |
| 2 | 100 |
| 3 | 010 |
| 4 | 001 |
| 5 | 110 |
| 6 | 011 |
| 7 | 101 |
| 8 | 111 |
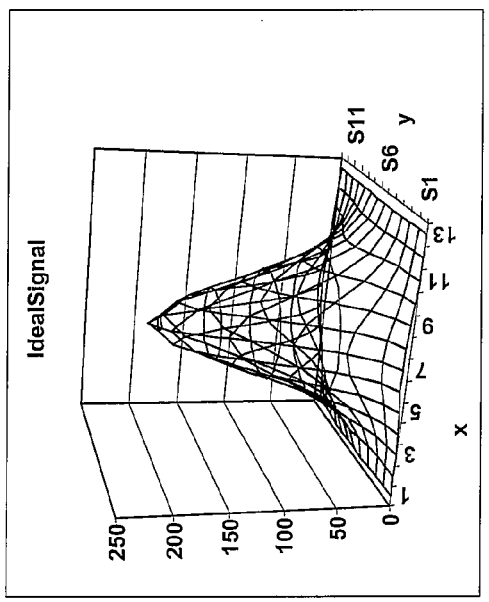
*Figure 1*
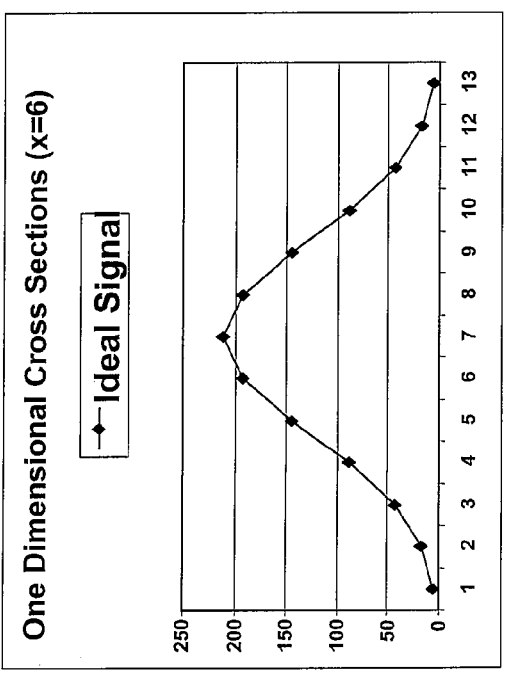
*Figure 2*
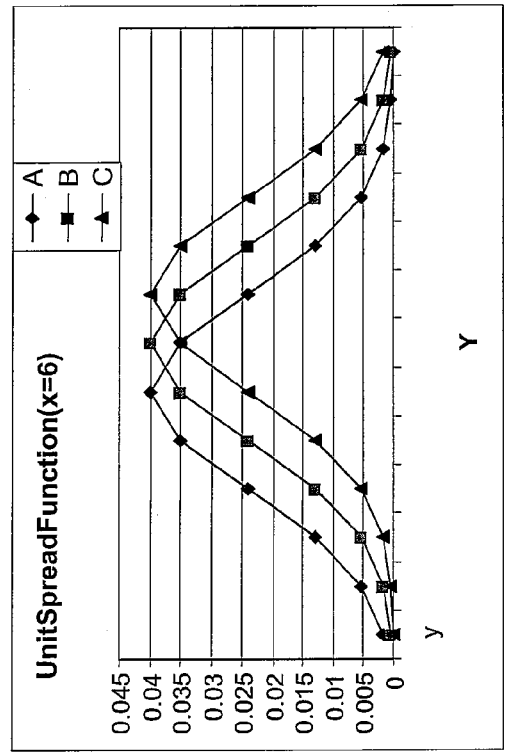
*Figure 4*

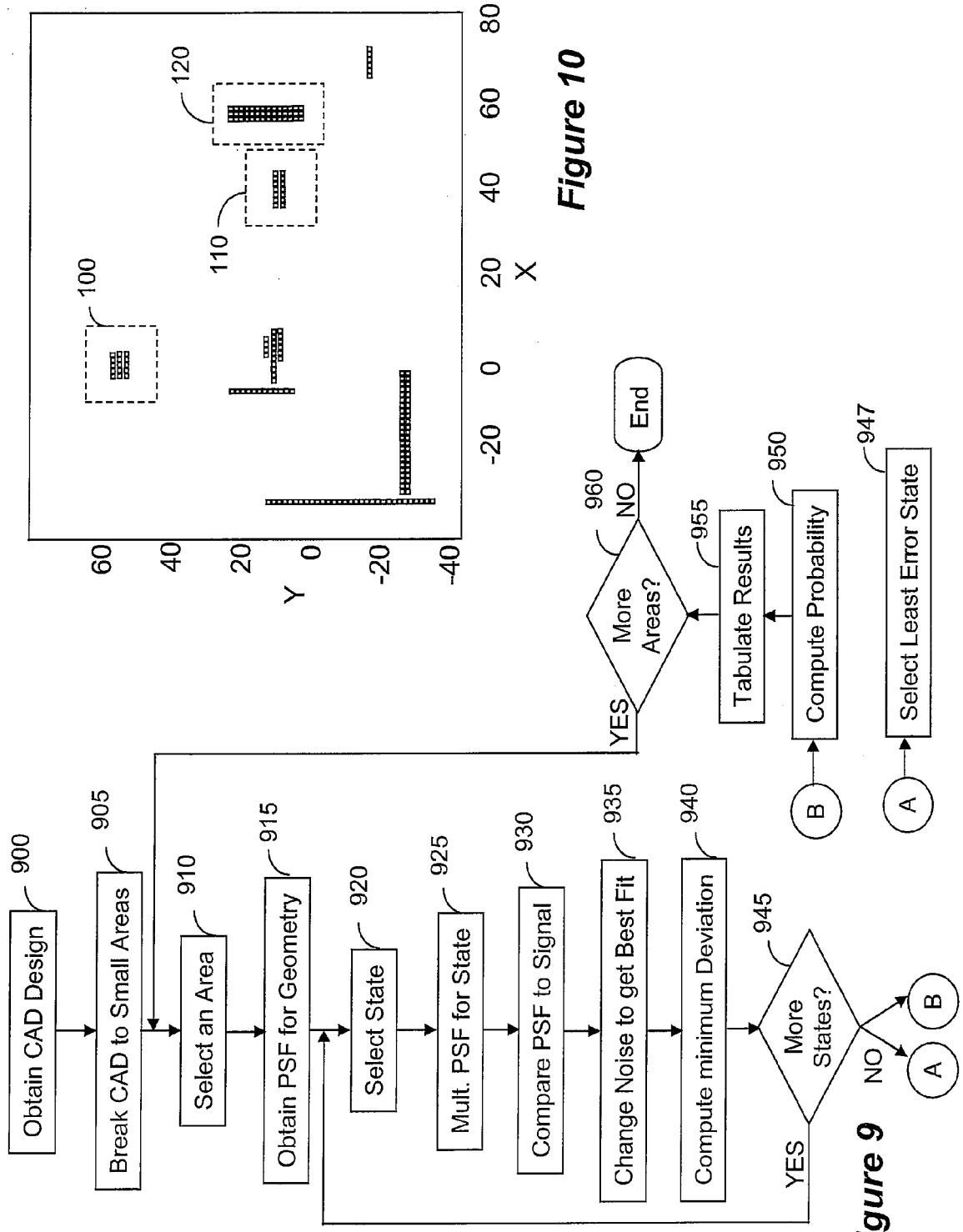

DATA SUMMARY TABLE

| STATE | INTENSITY | | | SIGMA(+-) | | | STATISTICS | | |
|---|---|---|---|---|---|---|---|---|---|
| | tA | tB | tC | tSigA | tSigB | tSigC | tChiSq | tChiDist | tFdist |
| 000 | 0.00 | 0.00 | 0.00 | 0.00 | 0.00 | 0.00 | 7087.97 | 0.00 | 0.00% |
| 100 | 5683.38 | 0.00 | 0.00 | 107.44 | 0.00 | 0.00 | 652.43 | 0.00 | 0.00% |
| 010 | 0.00 | 5956.67 | 0.00 | 0.00 | 110.04 | 0.00 | 221.86 | 0.00 | 10.72% |
| 001 | 0.00 | 0.00 | 5714.51 | 0.00 | 0.00 | 107.42 | 653.29 | 0.00 | 0.00% |
| 110 | 418.14 | 5556.36 | 0.00 | 280.84 | 288.92 | 0.00 | 219.31 | 0.00 | 11.50% |
| 011 | 0.00 | 5498.56 | 481.15 | 0.00 | 288.86 | 281.07 | 218.63 | 0.00 | 11.92% |
| 101 | 3101.31 | 0.00 | 3136.71 | 158.45 | 0.00 | 158.61 | 177.66 | 0.26 | 65.86% |
| 111 | 3493.73 | -755.47 | 3529.27 | 574.03 | 1061.85 | 574.38 | 176.84 | 0.25 | 0.00% |

*Table 2*

| STATE | INTENSITY | | | SIGMA(+-) | | | STATISTICS | | |
|---|---|---|---|---|---|---|---|---|---|
| | tA | tB | tC | tSigA | tSigB | tSigC | tChiSq | tChiDist | tFdist |
| POOLED | 3093.34 | 15.20 | 3128.77 | 220.79 | 292.84 | 220.60 | 177.69 | | |

*Table 3*

| BLENDED DATA....??? | | BLENDED VERDICT | Actual Value | Cumm. ON Probability |
|---|---|---|---|---|
| INTENSITY | Sigma(+/-) | | | |
| A weighted  3093.34 | 220.79 | ON | 3000 | 77.4% |
| B weighted  15.20 | 292.84 | ? | 0 | 34.1% |
| C weighted  3128.77 | 220.60 | ON | 3000 | 77.8% |

*Table 4*

| 'Transis... | Intensity | Xmin | Xmax | Ymin | Ymax | 'Estimate' | 'Sigma' | 'ON/OFF' | 'Probab... |
|---|---|---|---|---|---|---|---|---|---|
| 1 | 1000 | 4 | 10 | 6 | 6 | 1102.2 | 88.55 | 'ON' | 0.99819 |
| 2 | 2000 | 5 | 8 | 10 | 10 | 1999.5 | 159.19 | 'ON' | 0.99873 |
| 3 | 3000 | 40 | 47 | 5 | 5 | 3023 | 92.256 | 'ON' | 1 |
| 4 | 4000 | -4 | -4 | 2 | 20 | 3997.9 | 32.295 | 'ON' | 1 |
| 5 | 5000 | 70 | 76 | -20 | -20 | 5068.1 | 63.679 | 'ON' | 1 |
| 6 | 6000 | 40 | 47 | 7 | 7 | 6079.5 | 94.437 | 'ON' | 1 |
| 7 | 7000 | -30 | -30 | -32 | -38 | 6874.5 | 69.181 | 'ON' | 1 |
| 8 | 8000 | -30 | -30 | -30 | 10 | 8030.4 | 23.123 | 'ON' | 1 |
| 9 | 9000 | -28 | 0 | -29 | -31 | 9000.4 | 27.89 | 'ON' | 1 |
| 10 | 10000 | -2 | 10 | 8 | 8 | 9896.2 | 72.292 | 'ON' | 1 |
| 11 | 6000 | 60 | 60 | 0 | 20 | 5914.2 | 160.16 | 'ON' | 1 |
| 12 | 0 | 61 | 61 | 0 | 20 | 153.98 | 291.91 | '?' | 0.4993 |
| 13 | 6000 | 62 | 62 | 0 | 20 | 5935.8 | 161.38 | 'ON' | 1 |
| 14 | 0 | 0 | 1 | 50 | 50 | 56.01 | 561.22 | '?' | 0.22461 |
| 15 | 25000 | 2 | 3 | 50 | 50 | 23493 | 1417.8 | 'ON' | 0.99959 |
| 16 | 0 | 4 | 5 | 50 | 50 | 811.84 | 1031 | '?' | 0.55934 |
| 17 | 25000 | 0 | 1 | 52 | 52 | 24993 | 1127.2 | 'ON' | 0.99996 |
| 18 | 0 | 2 | 3 | 52 | 52 | 2616.5 | 2337 | '?' | 0.67231 |
| 19 | 25000 | 4 | 5 | 52 | 52 | 23891 | 1239 | 'ON' | 0.9998 |
| 20 | 0 | 0 | 1 | 54 | 54 | 118.43 | 645.52 | '?' | 0.44438 |
| 21 | 25000 | 2 | 3 | 54 | 54 | 24677 | 968.27 | 'ON' | 0.99996 |
| 22 | 0 | 4 | 5 | 54 | 54 | 1.109e-... | 0.029079 | 'OFF' | 0.0006... |

*Table 5*

SYSTEM AND METHOD FOR RESOLVING PHOTOEMISSION FROM SEMICONDUCTOR DEVICES

BACKGROUND

1. Field of the Invention

The subject invention relates to test and debug of semiconductor chips using device photoemission.

2. Related Art

It has been well known in the art that semiconductor devices emit light upon change of states, e.g. transistors switching on/off. This phenomenon has been used successively to test and debug semiconductor circuits using, e.g., infrared emission microscopy (IREM) and time-resolved emission microscopy. It has also been known in the art to use lasers to test and debug semiconductor circuits by examining modulations in the reflected laser light. The technique is generally referred to as LP (laser probing). For more information the reader is directed to review U.S. Pat. Nos. 5,208, 648, 5,220,403 and 5,940,545, which are incorporated herein by reference in their entirety. Additional related information can be found in Yee, W. M., et al. *Laser Voltage Probe (LVP): A Novel Optical Probing Technology for Flip-Chip Packaged Microprocessors*, in International Symposium for Testing and Failure Analysis (ISTFA), 2000, p 3-8; Bruce, M. et al. *Waveform Acquisition from the Backside of silicon Using Electro-Optic Probing*, in International Symposium for Testing and Failure Analysis (ISTFA), 1999, p 19-25; Kolachina, S. et al. *Optical Waveform Probing-Strategies for Non-Flip-chip Devices and Other Applications*, in International Symposium for Testing and Failure Analysis (ISTFA), 2001, p 51-57; Soref, R. A. and B. R. Bennett, *Electrooptical Effects in Silicon*. IEEE Journal of Quantum Electronics, 1987. QE-23(1): p. 123-9; Kasapi, S., et al., *Laser Beam Backside Probing of CMOS Integrated Circuits*. Microelectronics Reliability, 1999. 39: p. 957; Wilsher, K., et al. *Integrated Circuit Waveform Probing Using Optical Phase Shift Detection*, in International Symposium for Testing and Failure Analysis (ISTFA), 2000, p 479-85; Heinrich, H. K., *Picosecond Noninvasive Optical Detection of Internal Electrical Signals in Flip-Chip-Mounted Silicon Integrated Circuits*. IBM Journal of Research and Development, 1990. 34(2/3): p. 162-72; Heinrich, H. K., D. M. Bloom, and B. R. Hemenway, *Noninvasive sheet charge density probe for integrated silicon devices*. Applied Physics Letters, 1986. 48(16): p. 1066-1068; Heinrich, H. K., D. M. Bloom, and B. R. Hemenway, *Erratum to Noninvasive sheet charge density probe for integrated silicon devices*. Applied Physics Letters, 1986. 48(26): p. 1811.; Heinrich, H. K., et al., *Measurement of real-time digital signals in a silicon bipolar junction transistor using a noninvasive optical probe*. IEEE Electron Device Letters, 1986. 22(12): p. 650-652; Hemenway, B. R., et al., *Optical detection of charge modulation in silicon integrated circuits using a multimode laser-diode probe*. IEEE Electron Device Letters, 1987. 8(8): p. 344-346; A. Black, C. Courville, G Schultheis, H. Heinrich, *Optical Sampling of GHz Charge Density Modulation in Silicon Bipolar Junction. Transistors* Electronics Letters, 1987, Vol. 23, No. 15, p. 783-784, all of which are incorporated herein by reference in their entirety.

Recently a new phenomenon has been discovered that can also be utilized in test and debug of semiconductor devices. With the shrinking of the size of new devices, the devices are made "leaky" so that electron-hole recombination occurs during the static off state of the device, leading to IR emission. This emission increases as design rule decreases. That is, this phenomenon will express itself more pronouncedly as device generation progresses. This static emission can also be used for debug and test of semiconductor circuits. For more information on this phenomenon, the reader is directed to *Infrared Emission-based Static Logic State Imaging on Advanced Silicon Technologies*, Daniel R. Bockelman, Steve Chen, Borna Obradovic, Proceedings from the 28th International Symposium for Testing and Failure Analysis, 3-7 Nov. 2002, Phoenix, Ariz., which is incorporated herein by reference in its entirety.

As can be understood, beneficial use of the emission detection techniques can only be made if the location of the emission can be isolated and accurately linked to the devices that emit the light. Similar issue applies to laser-based systems, i.e., to use such tester one must resolve which device caused the modulation in the reflected laser light. However, as design rule shrinks, the density of the devices increases, making it very difficult and sometimes impossible to isolate the device that emits the light or modulates the laser beam. Additionally, emissions from neighboring devices enter the optical path of the testing system, thereby further complicating the task of isolating the emitting or modulating device. Ironically, while design rule shrinking leads to improved static emission, it also makes it more difficult to isolate the emitting devices.

In order to enable progress in the semiconductor industry pursuant to "Moore's Law," designer will continue to decrease design rules and increase device density. Therefore, the need for debug and testing becomes increasingly indispensable and the difficulty of resolving emitting/modulating devices must be solved.

SUMMARY

The following summary of the invention is provided in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Various embodiments of the subject invention provide means for isolating the emitting/modulating devices to enable emission and/or laser microscopy. Embodiments of the invention may be applied to various emission microscopy systems, such as static emission and dynamic emission, and to various laser microscopy systems.

According to aspects of the invention, a point spread function is convolved with the CAD data of the potential devices involved in the emission. The resulting convolved spread function of the transistor is compared with the actual measured signal and the difference between the convolved signal and the measured signal is examined. The calculated signal intensity of the devices is varied until the difference between the calculated signal and the measured signal is minimized. The best fit is performed for each on/off state for all configurations of the involved devices. The variance of the best curve fit for all of the configurations is used to assign probability to each state. Generally, the best fit, i.e., smallest variance would immediately lead to the correct solution. That is, the best fit would indicate the correct state of each of the involved devices, thereby indicating which devices emit. At times, when the transistors are extremely close, a weighted solution is calculated. The weights are based on the probability of each solution. This entire calculation may be repeated several times while changing the CAD alignment. The results having the smallest variance are taken as the correct CAD alignment.

A method is described for resolving light signal obtained from a semiconductor device under test (DUT) in an optical system, the method comprising: obtaining a light signal from an area of the DUT; obtaining a CAD layout of transistors present in the area of the DUT; generating a spread function for the transistors from a point spread function (PSF) of the optical system; computing the intensity of discrete light emission of each transistor by comparing the spread function to the light signal; and outputting the estimated discrete intensity.

The method may further comprise: determining a plurality of state combinations, each combination comprising unique mixture of states of the transistors; for each of the plurality of state combinations: generating a combination spread function and comparing the combination spread function to the light signal and from the comparison obtaining an error and discrete intensity of emission from each transistor; the method proceeds by selecting the state combination having the smallest error as the true state combination; and outputting the mixture of states corresponding to the true state combination.

The comparing the combination spread function to the light signal may further comprise performing a least square minimization operation on the combination spread function. The comparing the combination spread function to the light signal may also comprise performing a Chi-Square minimization operation on the combination spread function. The method may further comprise computing the probability of each state combination. The computing the probability may comprise computing a ChiSquare distribution probability. The computing the probability may comprise computing an F-distribution probability. The method may further comprise calculating pooled intensity for each transistor, the pooled intensity reflecting calculated intensity for each transistor with respect to the probability of each state combination. The method may further comprise calculating pooled error for all the state combinations, the pooled error reflecting calculated error for each state combination with respect to the probability of each state combination. The method may further comprise calculating a sigma for each transistor, the sigma reflecting a confidence measure of the minimum error. The method may further comprise calculating a pooled sigma for each transistor, the pooled sigma reflecting calculated sigma for each transistor with respect to the probability of each state combination. The method may further comprise calculating cumulative probability for each transistor, the cumulative probability reflecting the probability for the intensity calculated for each transistor at each state combination. The method may further comprise iteratively performing all the steps a plurality of times while varying CAD alignment for each iteration, and selecting the alignment resulting in the smallest error as the correct CAD alignment.

A system for resolving light collected from device under test (DUT) is provided, comprising: a first input receiving optical signal correlating to the light collected from the DUT; a second input receiving CAD layout of the DUT; a spread function engine generating a spread function for each state combination of plurality of transistors selected from the CAD layout; a comparator receiving the optical signal and each of the spread functions and providing a plurality of error signals, each error signal corresponding to difference between the optical signal and the spread function of one state combination; a decision engine receiving the error signals of the plurality of state combinations and outputting a decision signal indicating the most probable state combination. The system may further comprise a transformation engine operating on the spread function of each state combination to obtain the smallest error for each state combination. The system may further comprise a statistics engine generating a plurality of probabilities, each probability indicating the probability of a state to generate signal comparable to the optical signal. The system may further comprising a statistics engine generating a plurality of relative probabilities, each probability indicating the probability of a state, with respect to other states, to generate signal comparable to the optical signal. The system may further comprise a CAD aligner, the CAD aligner providing CAD alignment coordinates. The system may further comprise a decision engine receiving output signals from the comparator and the statistics engine and generating selecting a most probably state based on the output signals.

An optical tester for testing a semiconductor device under test (DUT) is provided, comprising: a collection optics for collecting light from the DUT; a sensor for sensing the light from the collection optics and generating a collection signal; an input for receiving CAD layout of the DUT; a spread function generator generating spread function for a plurality of transistors selected from the CAD layout; a comparator comparing the spread function to the collection signal and outputting an error signal.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1 is a 3-d plot illustrating an ideal point spread function emission of a single point emitter, as simulated in developing the subject invention.

FIG. 2 is a cross section of the plot of FIG. 1.

FIG. 3 is an illustration of a part of a semiconductor chip, having three transistors, A, B, and C, closely spaced thereupon, for explaining an embodiment of the subject invention.

FIG. 4 is a plot of the point spread function of the three transistors A, B and C depicted in FIG. 3, simulated according to an embodiment of the invention.

FIG. 9 depicts a flow chart for a process to resolve the emission according to an embodiment of the invention.

FIG. 10 depicts a CAD layout design for the chip area of the image of FIG. 7.

Table 1 illustrates the states transistors A, B and C may assume. Table 2 is an example of a tabulated display. Table 3 illustrates an example where the weighted results are referred to as pooled. Table 4 is an example showing the weighted intensity and sigma of each transistor. Table 5 illustrates the results from one of the runs per FIG. 9.

DETAILED DESCRIPTION

Various embodiments of the invention provide methods and systems for resolving light emission from closely spaced transistors. The embodiments described enable resolution beyond what is possible with optical systems. That is, the optical system's resolution is limited by the wavelength of the light used to image the transistors which, in semiconductor devices, is limited to infrared light due to the silicon's optical transmission characteristics. Various embodiments described utilize point spread function of the optical system to resolve the emission. The point spread function emulates the emission as a combination of point emitters, based on the linearity property of the light.

FIG. 1 is a 3-d plot illustrating an ideal point spread function emission of a single point emitter. FIG. 2 is a cross section of the plot of FIG. 1. That is, for an optical system without further electrical aberrations and system noise, the signal obtained from a point emitter should appear as shown in FIGS. 1 and 2.

FIG. 3 is an illustration of a part of a semiconductor chip, having three transistors, A, B, and C, closely spaced thereupon. In operation, these transistors may assume any of the states illustrated in Table 1. For example, in state 1 none of the transistors emits light, while is state 2 only transistor A emits light. FIG. 4 is a plot of the point spread function of the three transistors A, B and C depicted in FIG. 3. Incidentally, throughout this description, depending on the context, references to a transistor being "on" or "off" may mean that it is emitting or not emitting light, and not necessarily being in the electrically conductive or non-conductive state. In fact, as discussed above, static emission may result when the transistor is electrically non-conductive. Moreover, the use of the terms "on" or "emitting" herein is intended to include light reflection from the transistor.

Figure 5:
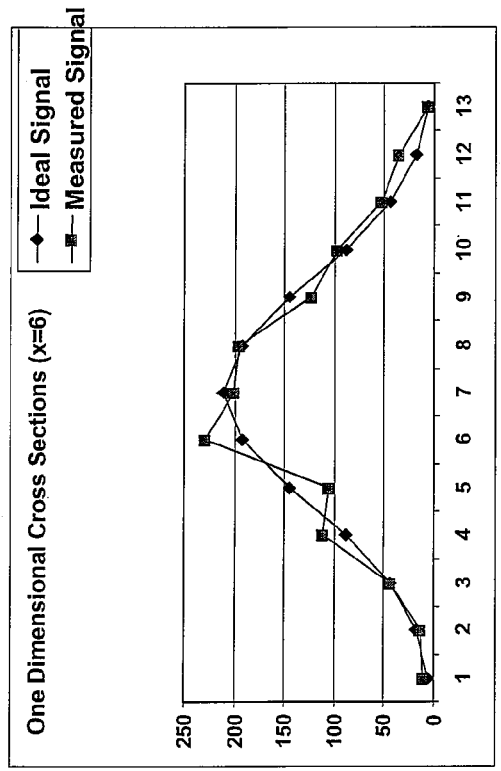
FIG. 5 is a 3-d plot of a measured signal from a location having three transistors arranged as illustrated in FIG. 3, as simulated in developing the subject invention, according to an embodiment of the invention.
Figure 6:
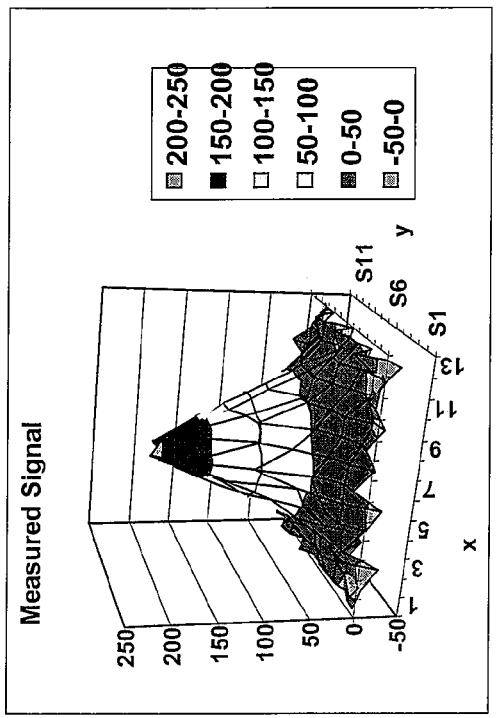
FIG. 6 is a plot of a cross section of the measured signal overlaid on an ideal point spread function plot.

FIG. 5 is a 3-d plot of a measured signal from a location having three transistors arranged as illustrated in FIG. 3. For this illustration, the signal is actually a simulated signal with a random number generator used for introducing noise into the signal. As can be seen, the signal differs from the ideal signal of a point emitter, mainly due to noise in the system. Therefore, when the transistors are closely spaced, it is hard to resolve which transistor emits light. FIG. 6 is a plot of a cross section of the measured signal overlaid on an idea point spread function plot. This plot also illustrates the difficulty in resolving the emission.

Figure 7:
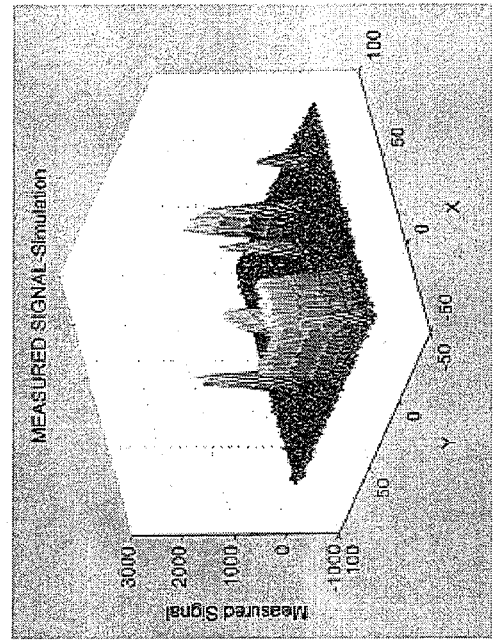
FIG. 7 is measured signal of emission from multiple transistors in an area of a semiconductor chip, as simulated in developing the subject invention.
Figure 8:
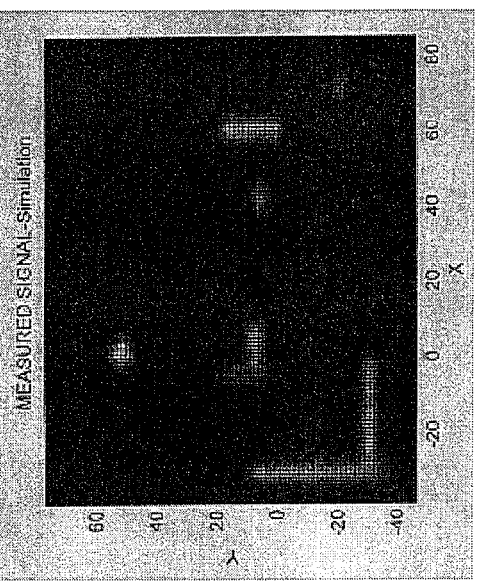
FIG. 8 is a 3-d plot of the signal measured in FIG. 7.

FIG. 7 is measured signal of emission from multiple transistors in an area of a semiconductor chip, while FIG. 8 is a 3-d plot of the signal measured in FIG. 7. For this particular example, the signal has been simulated, but it faithfully replicates the appearance of a real measured signal. The following provides examples of how such a signal can be resolved.

FIG. 9 depicts a flow chart for a process to resolve the emission according to an embodiment of the invention. The process begins at Step 900 where the CAD design of the area under investigation is obtained. The CAD design for the chip area of FIG. 7 is depicted in FIG. 10, where the layout of various devices is shown with respect to an arbitrary (x,y) Cartesian coordinates. When, as in this example, the area of the chip includes clusters of closely spaced transistors, in Step 905 the area is broken to smaller, more manageable areas along these clusters, as illustrated by broken-line rectangles 100, 110, and 120. An area for testing is selected in Step 910 and for each selected area the transistors are identified and the list of possible states is assembled. Notably, by breaking the area into smaller clusters, the number of states that the system needs to consider in the calculations is reduced. The maximum size of the clusters, i.e., the maximum number of transistors within a cluster, can be determined according to the processing power of the system.

At Step 915 the point spread function (PSF) is calculated for the geometry of the devices in the area selected in Step 910. Alternatively, the PSF for all of the various device geometries can be calculated beforehand so as to build a PSF library. In such a case, at Step 915 a proper PSF corresponding to the geometry of the area selected in Step 910 is selected in Step 915 from the library. At Step 920 a state is selected and at Step 925 the PSF is multiplied by the selected state. For example, if the area selected has three transistors aligned in a single line, as sown in the example of FIG. 3, for the first state shown in Table 1 the PSF will be multiplied by (0,0,0), for the second state by (1,0,0), etc.

The resulting calculated PSF is then compared to the measured signal in Step 930. At Step 935 a "noise" is introduced to the PSF so as to obtain the best fit to the measured signal. This step can be performed using a formula or by iteratively searching for a multiplier that would result in the best fit between the PSF of the selected state and the actually measured signal. In essence, the goal is to minimize the error between the curve of the PSF for the selected state and the measured signal. One way to do this iteratively is to vary the intensity of each transistor that is defined to be "on," i.e., emitting, for the selected state until the calculated PSF best matches the measured signal.

When the best fit is obtained, the minimum deviation is calculated at Step 940. For this step, any known method for calculating the deviation between the two curves may be used. For example, the known least square or ordinary least square method may be used to obtain the best curve fit and the minimum residual set as the minimum deviation. The least square method assumes that errors are randomly distributed. However, according to one embodiment of the invention, the noise level is assumed not to be randomly distributed, but rather correlated to the intensity value itself. For example, the error of each measured data point may be assumed to equal to the square root of the measured data point, i.e., the intensity I at each point may equal $I +/- \sqrt{I}$. Therefore, according to one embodiment, the Chi Square analysis is used instead. Generally, the Chi Square used in this embodiment is in the form $(I_M - I_E)^2/N$, where $I_M$ is the measured intensity and $I_E$ is the expected intensity (i.e., PSF), and N is the noise squared ($N = I_E + n^2$, where n is the sensing noise). To obtain the deviation, referred to in Table 2 as tChiSq, a summation is performed over the number of sampled points:

$$tChiSq = \Sigma (I_M - I_E)^2/N$$

As can be understood, the number of sampled points can be varied to provide fine or coarse approximation, as required by the particular application.

At Step 945 it is determined whether there are more states to calculate and, if so, the process circularly reverts to Step 920. If all of the states have been calculated, according to one embodiment the process proceeds according to process A, wherein at Step 947 the state having the smallest error is selected as the correct state. The intensity calculated for each transistor for the selected state is provided as an indication of which transistor emits light. According to another embodiment, the process proceeds according to process B, which starts at Step 950, where the relative probability of each state is calculated. Of course, both processes A and B can be implemented as a cross check on the final selection.

The relative probability of each state may be calculated from the resulting deviation obtained in Step 940. Various known statistical methods may be used to calculate the relative probability. According to one embodiment, the Chi-Square distribution is used, while in another an F-distribution is used. Of course, both may be used, as shown in Table 2 wherein the Chi-Square distribution is noted as tChiDist and the F-Distribution is noted as tFdist. The results are tabulated in Step 955 and may be displayed for the user to determine which state is most likely to generate the measured signal. An example of a tabulated display is shown in Table 2.

It should be noticed that at this step, non-physical values may be omitted from the calculations. For example, if during the calculation of Step 940 the best curve fit is obtained when an intensity of any transistor is set to a negative value, that particular state may be removed as non-physical, i.e., the transistors are only emitters and not absorbers.

The example shown in Table 2 is for the three-transistor layout as shown in FIG. 3, with the possible states illustrated in Table 1. For each state the intensity values have been changed until the best fit to the measured signal has been achieved. Then the "best fit" value of the intensities, tA, tB, and tC, for each transistor was recorded for each selected state. The minimum deviation in this example is shown as tChiSq. As can be seen in this example, the worst deviation is for the first state, as we compare a PSF of no emission with a measured signal showing emission. On the other hand, the best deviation is shown for both states (101) and (111). Moreover, the Chi-squared distribution is similar for both states (0.26 and 0.25, respectively). Therefore, at first glance it may seem that both states may present an equally valid solution. However, for state (111) the "best fit" intensity of tB was set to a negative value (−755.47). This is a non-physical solution that may be removed during the probability calculation as noted above. Additionally, the F-Distribution strongly favors state (101). Therefore, it stands to reason that the correct solution is state (101).

Taking a step back, the resulted statistics shown in Table 2 actually make sense from the physical point of view. That is, due to the linearity property, two closely spaced emitters would produce a signal that would add up to generally look like a widened PSF curve of a single emitted centrally situated between the two emitters. Consequently, at certain resolution both states (101) and (111) may seem to fit, as both would generate a widened PSF curve of a single emitter. However, at closer resolution, the resulting signal of the two emitters will have a dip at its center (i.e., between the two peaks of the two individual emitters). This is why in order to fit state (111) the intensity of the middle transistor had to be adjusted to a negative number, i.e., to generate the dip in the middle. This fact increases the confidence that the actual state is indeed (101). Therefore, according to another embodiment, negative intensity values are not removed, but rather used to confirm or increase the confidence in the finally selected solution.

According to a further embodiment of the invention, further processing is performed to obtain increased confidence in the selected state. According to this embodiment, once the processing of FIG. 9 is completed for a selected area, a weighted sum is obtained for the solution, taking into account the resulting probability of each state. An example is illustrated in Table 3, where the weighted results are referred to as pooled. For example, the intensities for transistor tA are multiplied by the probability of each state and then summed. As can be seen in Table 3, after this operation the pooled intensities of transistors A and C are much higher than that of transistor. B. This supports the conclusion that the correct state is (101).

Figure 11:
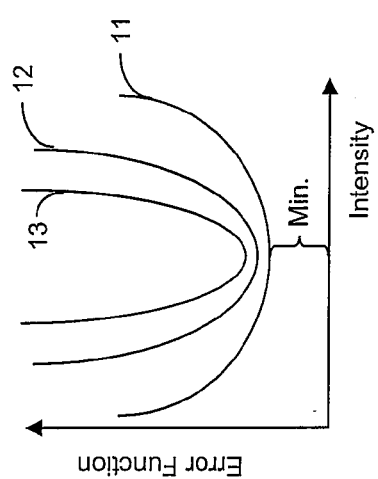
FIG. 11 provides an illustration of three error functions plotted against the intensity, for explaining the sigma feature of the invention.

According to a further embodiment of the invention, when the best fit PSF curve is obtained, a value is calculated to indicate the strength of this solution. This value is called herein sigma and it is shown in Tables 2 and 3 as tSigA, tSigB, and tSigC. FIG. 11 provides an illustration, wherein three error functions 11, 12, and 13, are plotted against the intensity. The minima indicate the least error, i.e., the best fit. However, as can be seen, the curve of plot 11 is flatter than that of curve 13. Therefore, the least error solution selected from curve 13 is of higher certainty than that obtained from curve 11. This measure is reflected in the sigma value shown in Tables 2 and 3. In these tables, the larger the sigma value is, the lower the confidence. Also, when the sigma value approaches the intensity value, it indicates high uncertainty in the intensity value. Moreover, when the sigma value exceeds the intensity value, the intensity value at that state cannot be relied upon. For example, for the state (111) in Table 2, the sigma value of transistor B is higher than its intensity value for that state. This confirms that state (111) is not probable. A similar indication can be seen in the pooled values, i.e., the sigma value for transistor B is higher than the weighted intensity of transistor B, indicating that the intensity value of transistor B is unreliable.

According to another embodiment of the invention, a decision table is constructed and presented to the user. An example of such a table is depicted in Table 4. In table 4, the weighted intensity and sigma of each transistor are shown. Additionally, for each transistor the cumulative probability that the transistor is on is calculate and presented in the table. This can be done, e.g., by adding the on probability in the F-Distribution obtained in table 2. As can be seen from Table 4, the probability that transistor A is on is very high and its predicted intensity is high and much larger than its sigma. Similar results can be seen for transistor C. Therefore, the system may issue a decision, called blended verdict, that transistors A and C are on. On the other hand, while the cumulative probability that transistor B is on is not negligible, its sigma is much higher than its intensity. Therefore, it is highly unlikely that transistor B is on and the system may issue a decision that it is off. If one wishes to be conservative, the system may issue an undecided verdict as illustrated in Table 4. However, even if it is undecided, if one takes transistor B to be on, it is clear that its intensity is very faint as compared to A and C. As noted earlier, the measured intensity values for these examples were actually obtained by simulation, using a random number generator for generating the noise. The "noise free" intensity of the simulation is shown in Table 4 under "Actual Value." As can be seen, the weighted intensities closely match the actual intensities used for the simulation.

The blended verdict can be tailored to particular situations and to provide different "levels of comfort." One may take a conservative approach and force a decision only when the probabilities are very high, with very low sigma and clear decision. Conversely, one may chose a relaxed criteria for the blended verdict. According to one example, for a particular transistor the verdict is declared only if the probability of the transistor being in the "on" state is twice as the probability of it being in the "off" state. According to another example, the number of states having a probability that is at least half the probability of the most likely state is counted. If the number is larger than the number of transistors in the tested area, no decision is issued.

The process of FIG. 9 was run on the entire area shown in FIG. 7 iteratively, using the random number generator to introduce noise. The results from one of the runs are tabulated in Table 5. Notably, the developed system is fully automated and performs the calculations discussed above to resolve emission from each cluster of transistors. In this particular run, the system automatically provided an ON/OFF decision for 17 out of the 22 transistors. As can be seen from Table 5, the system's estimated intensities closely match the simulated intensities for all of the transistors for which the system made an ON/OFF decision. In fact, even for transistors for which the system did not provide a decision, for four out of five transistors the intensities were very close to the simulated intensities.

Figure 12:
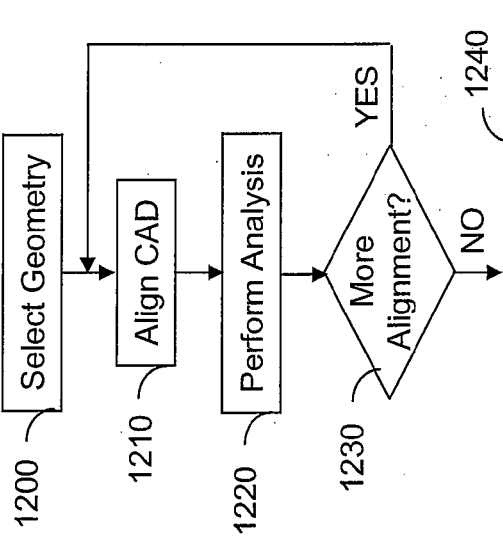
FIG. 12 depicts a flow chart for eliminating misregistration errors according to an embodiment of the invention.

According to another embodiment of the invention, the system also takes into account possible misregistration of the CAD layout to the device under test (DUT). FIG. 12 depicts a flow chart for eliminating misregistration errors according to an embodiment of the invention. According to this embodiment, once a geometry is selected at Step 1200 (corresponding to Step 910 in FIG. 9), an iterative analysis is performed as follows. At Step 1210 a CAD layout alignment with respect to the DUT is chosen. Then the analysis as described with respect to FIG. 9 is performed at Step 1220 and the results are stored. At Step 1230 it is determined whether another alignment should be chosen. That is, the system is programmed to select a predetermined number of alignments of the CAD. This can be done by storing preset moves in the x and y direction so that in each iteration the CAD design is moved a predetermined amount in the x-direction, the y-direction, or both. If at Step 1230 it is determined that another alignment needs to be checked, the process circularly reverts to Step 1210. Otherwise, the process proceeds to Step 1240 where all of the calculated pooled Chi-Squared values are compared, and at Step 1250 the CAD alignment resulting in the lowest pooled Chi-squared value is selected as the proper alignment and the results from this alignment are used for resolving the emission.

Figure 13:
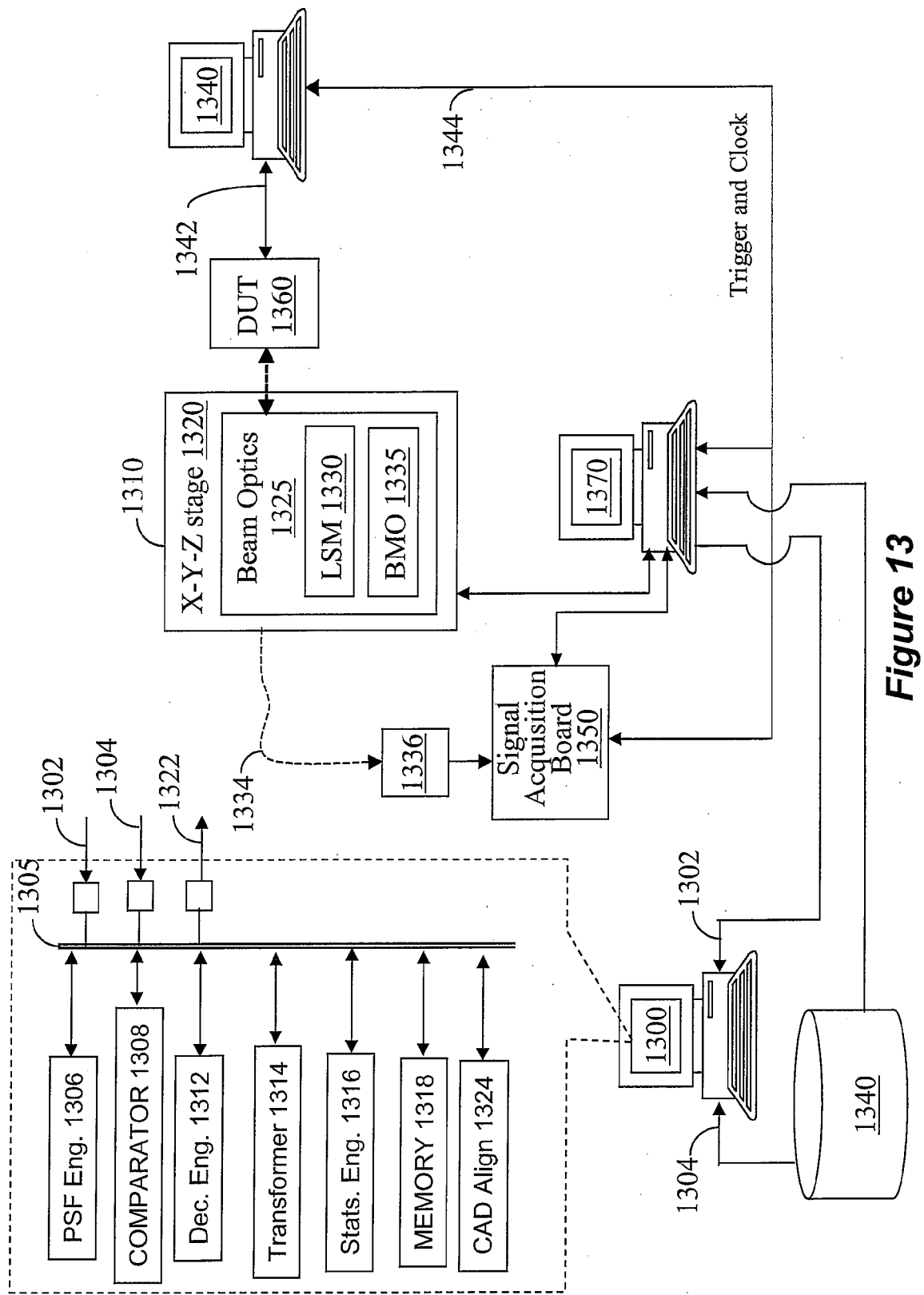
FIG. 13 is a schematic diagram illustrating alternative embodiments for systems according to the invention.

FIG. 13 is a schematic diagram illustrating alternative embodiments for systems according to the invention. In FIG. 13, DUT 1360 is undergoing testing by, for example, receiving test vectors 1342 from tester 1340. The DUT may be placed on optical tester 1310, such as, e.g., EmiScope® available from Credence Systems of Fremont, Calif. Generally the optical tester 1310 would include an x-y-z stage 1320 for navigation over the DUT, a beam manipulation optics, BMO 1335, consisting various optical elements, such as lenses and/or mirrors, and scanning mechanism, such as a laser scanning microscope 1330. The elements are generic and not pertinent to the embodiments of the invention.

By the use of the above noted testing elements, light is collected from various areas of the DUT by, e.g., fiber optics 1334, and is sensed by light sensor 1336, such as an avalanche photodiode (APD). A signal acquisition board 1350 may be coupled to the sensor to receive and condition the signal of the sensor 1336. The signal is then applied to a processor 1370, such as a specifically programmed PC. As shown, the processor 1370 may also be used to control the various elements of the optical tester 1310. Additionally, trigger and clock signal may be provided from the tester 1340 to the signal acquisition board 1350 and/or the processor 1370.

According to one embodiment of the invention, the processing to resolve the emission detected by the optical tester 1310 is performed by a stand-alone system 1300, which may be implemented in the form of specially programmed general purpose computer, or specifically constructed hardware and/or software and/or firmware. The acquired and conditioned signal is sent from the processor 1370 to the optical signal input 1302 of the resolving system 1300. The system 1300 then obtains the CAD layout of the DUT from the CAD database 1340, via CAD input 1304. The system 1300 then follows any of the processes disclosed herein to resolve the detected emission. According to yet another embodiment, the system 1300 is constructed integrally to the processor 1370. In such a case, the CAD layout is provided from the CAD database 1340 to the processor 1370.

The callout in FIG. 13 illustrate an embodiment of the resolving system 1300, whether it being a stand-alone system or integrally to the processor 1370. The system 1300 has a bus 1305, to which various elements are coupled to communicate and provide signals to other elements. The optical signal input 1302 and the CAD layout input 1304 are connected to the bus 1305 and provide the signal onto the bus. Also, an output 1322 provides the output of the various calculations to, e.g., a monitor, a printer, etc. To enable the processing as described herein, the system 1300 may include a point spread function generator 1306 that generates the point spread function of the transistors and the various selected states. A comparator 1308 compares the PSF from the PSF generator 1306 to the optical signal obtained from the input 1302. A decision engine 1312 receives the outcome of various calculations performed by the various elements of the system 1300 and provides an output for the resolving decision. A statistics engine 1316 performs the various statistical calculations, such as the Chi-Square, Chi-distribution, F-distribution, etc. ad provides the output to the decision engine 1312. A transformation engine 1314 operates on the PSF to seek the best fit to the optical signal. Additionally, a CAD aligner 1324 provides various CAD coordinates to align the CAD layout and iteratively calculate error for various CAD alignments until the smallest error is obtained, thereby selecting the best CAD alignment coordinates.

Memory 1318 may be used by the various elements to store data. Memory 1318 may include memory area for storing PSF library for various transistor geometries. As can be understood, any of the elements of system 1300 may be provided in the form of hardware, software, firmware, or any combination thereof. Moreover, it should be understood that all of the elements of system 1300 may be implemented by a single processor executing specifically designed software code.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. Various aspects and/or components of the described embodiments may be used singly or in any combination in the plasma chamber arts. It is intended that the specification and examples be considered as exemplary only, with a true scope and spirit of the invention being indicated by the following claims.

The invention claimed is:

1. A method for resolving light signal obtained from a semiconductor device under test (DUT) in an optical system, comprising:

obtaining a light signal from an area of the DUT;

obtaining a CAD layout of transistors present in the area of the DUT;

generating a spread function for the transistors from a point spread function (PSF) of the optical system;

computing the intensity of discrete light emission of each transistor by comparing the spread function to the light signal;

outputting the estimated discrete intensity.

2. The method of claim 1, further comprising:

determining a plurality of state combinations, each combination comprising unique mixture of states of the transistors;

for each of the plurality of state combinations:

generating a combination spread function;

comparing the combination spread function to the light signal and from the comparison obtaining an error and discrete intensity of emission from each transistor;

selecting the state combination having the smallest error as the true state combination;

outputting the mixture of states corresponding to the true state combination.

3. The method of claim 2, wherein comparing the combination spread function to the light signal further comprises performing a least square minimization operation on the combination spread function.

4. The method of claim 2, wherein comparing the combination spread function to the light signal further comprises performing a Chi-Square minimization operation on the combination spread function.

5. The method of claim 2, further comprising computing the probability of each state combination.

6. The method of claim 5, wherein computing the probability comprises computing a ChiSquare distribution probability.

7. The method of claim 5, wherein computing the probability comprises computing an F-distribution probability.

8. The method of claim 5, further comprising calculating pooled intensity for each transistor, said pooled intensity reflecting calculated intensity for each transistor with respect to the probability of each state combination.

9. The method of claim 5, further comprising calculating pooled error for all the state combinations, said pooled error reflecting calculated error for each state combination with respect to the probability of each state combination.

10. The method of claim 2, further comprising calculating a sigma for each transistor, said sigma reflecting a confidence measure of the minimum error.

11. The method of claim 10, further comprising calculating a pooled sigma for each transistor, said pooled sigma reflecting calculated sigma for each transistor with respect to the probability of each state combination.

12. The method of claim 5, further comprising calculating cumulative probability for each transistor, said cumulative probability reflecting the probability for the intensity calculated for each transistor at each state combination.

13. The method of claim 2, further comprising iteratively performing all the steps recited in claim 2 a plurality of times while varying CAD alignment for each iteration, and selecting the alignment resulting in the smallest error as the correct CAD alignment.

14. A system for resolving light collected from device under test (DUT), comprising:

a first input receiving optical signal correlating to the light collected from the DUT;

a second input receiving CAD layout of the DUT;

a spread function engine generating a spread function for each state combination of plurality of transistors selected from the CAD layout;

a comparator receiving the optical signal and each of the spread functions and providing a plurality of error signals, each error signal corresponding to difference between the optical signal and the spread function of one state combination;

a decision engine receiving the error signals of the plurality of state combinations and outputting a decision signal indicating the most probable state combination.

15. The system of claim 14, further comprising a transformation engine operating on the spread function of each state combination to obtain the smallest error for each state combination.

16. The system of claim 14, further comprising a statistics engine generating a plurality of probabilities, each probability indicating the probability of a state to generate signal comparable to the optical signal.

17. The system of claim 14, further comprising a statistics engine generating a plurality of relative probabilities, each probability indicating the probability of a state, with respect to other states, to generate signal comparable to the optical signal.

18. The system of claim 14, further comprising a CAD aligner, said CAD aligner providing CAD alignment coordinates.

19. The system of claim 17, further comprising a decision engine receiving output signals from the comparator and the statistics engine and generating selecting a most probably state based on the output signals.

20. An optical tester for testing a semiconductor device under test (DUT), comprising:

a collection optics for collecting light from the DUT;

a sensor for sensing the light from the collection optics and generating a collection signal;

an input for receiving CAD layout of the DUT;

a spread function generator generating spread function for a plurality of transistors selected from the CAD layout;

a comparator comparing the spread function to the collection signal and outputting an error signal.

* * * * *